(12) United States Patent
Anderson et al.

(10) Patent No.: US 6,518,817 B2
(45) Date of Patent: Feb. 11, 2003

(54) VOLTAGE BUFFER

(75) Inventors: Jeremy R. Anderson, Hillsboro, OR (US); Siva G. Narendra, Portland, OR (US); Vivek K. De, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/894,464

(22) Filed: Jun. 28, 2001

(65) Prior Publication Data

US 2003/0001632 A1 Jan. 2, 2003

(51) Int. Cl.[7] .................. H03K 19/0185; G05F 1/10
(52) U.S. Cl. ............................. 327/333; 327/537
(58) Field of Search ............................. 327/534, 535, 327/537, 333, 112; 326/83

(56) References Cited

U.S. PATENT DOCUMENTS

| | | | |
|---|---|---|---|
| 6,100,751 A | 8/2000 | De et al. | 327/534 |
| 6,166,584 A | 12/2000 | De | 327/534 |
| 6,177,788 B1 | 1/2001 | Narendra et al. | 323/315 |
| 6,218,892 B1 * | 4/2001 | Soumyanath et al. | 327/537 |
| 6,218,895 B1 | 4/2001 | De et al. | 327/566 |
| 6,304,110 B1 * | 10/2001 | Hirano | 327/534 |
| 6,359,491 B1 * | 3/2002 | Cairns et al. | 327/333 |
| 6,373,321 B1 * | 4/2002 | Yamauchi et al. | 327/537 |

\* cited by examiner

*Primary Examiner*—Toan Tran
(74) *Attorney, Agent, or Firm*—Schwegman, Lundberg Woessner & Kluth PA

(57) ABSTRACT

A voltage buffer includes a high impedance input and a low impedance output. In one example, the buffer includes a source-follower FET and load FET, at least one of which has a forward-biased source-body junction. Another example includes a cascade of two source-follower FETs of opposite conductivity types, and corresponding load devices. Another example further reduces the buffer's output impedance by using a diode-connected load device. The voltage buffer is effectively referenced to a first power supply and effectively isolated from a second power supply. Therefore, it tracks variations in the first power supply voltage, but does not track variations in the second power supply voltage.

36 Claims, 16 Drawing Sheets

VOLTAGE BUFFER

TECHNICAL FIELD

The present system relates generally to integrated circuits and associated methods and particularly, but not by way of limitation, to a voltage buffer and associated methods.

BACKGROUND

Integrated circuits often require substantially constant bias voltages. A precision voltage reference circuit, such as a bandgap voltage reference, may be used to generate a precise voltage for use by other circuits. However, such precision voltage reference circuits often lack the ability to provide a stable voltage over a wide range of load currents being drawn by one or more of these other circuits using the precision reference voltage. Moreover, when more than one load circuit shares the same voltage reference, the collective load capacitance imposed by such circuits on the voltage reference can be substantial. Furthermore, some of these load circuits may involve transistor switching, which can result in large current spikes being drawn from the voltage reference. Others of these load circuits may involve coupling and decoupling capacitors to and from the voltage reference. This can also result in large current spikes being drawn from the voltage reference. In order to provide a stable reference voltage over a variety of circuit conditions, there is a need for a voltage buffer circuit having a low output impedance and a large current drive capability.

BRIEF DESCRIPTION OF THE DRAWINGS

In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

DETAILED DESCRIPTION

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that the embodiments may be combined, or that other embodiments may be utilized and that structural, logical and electrical changes may be made without departing from the spirit and scope of the present invention. The following detailed description is, therefore, not to be taken in a limiting sense, and the scope of the present invention is defined by the appended claims and their equivalents.

Figure 1:
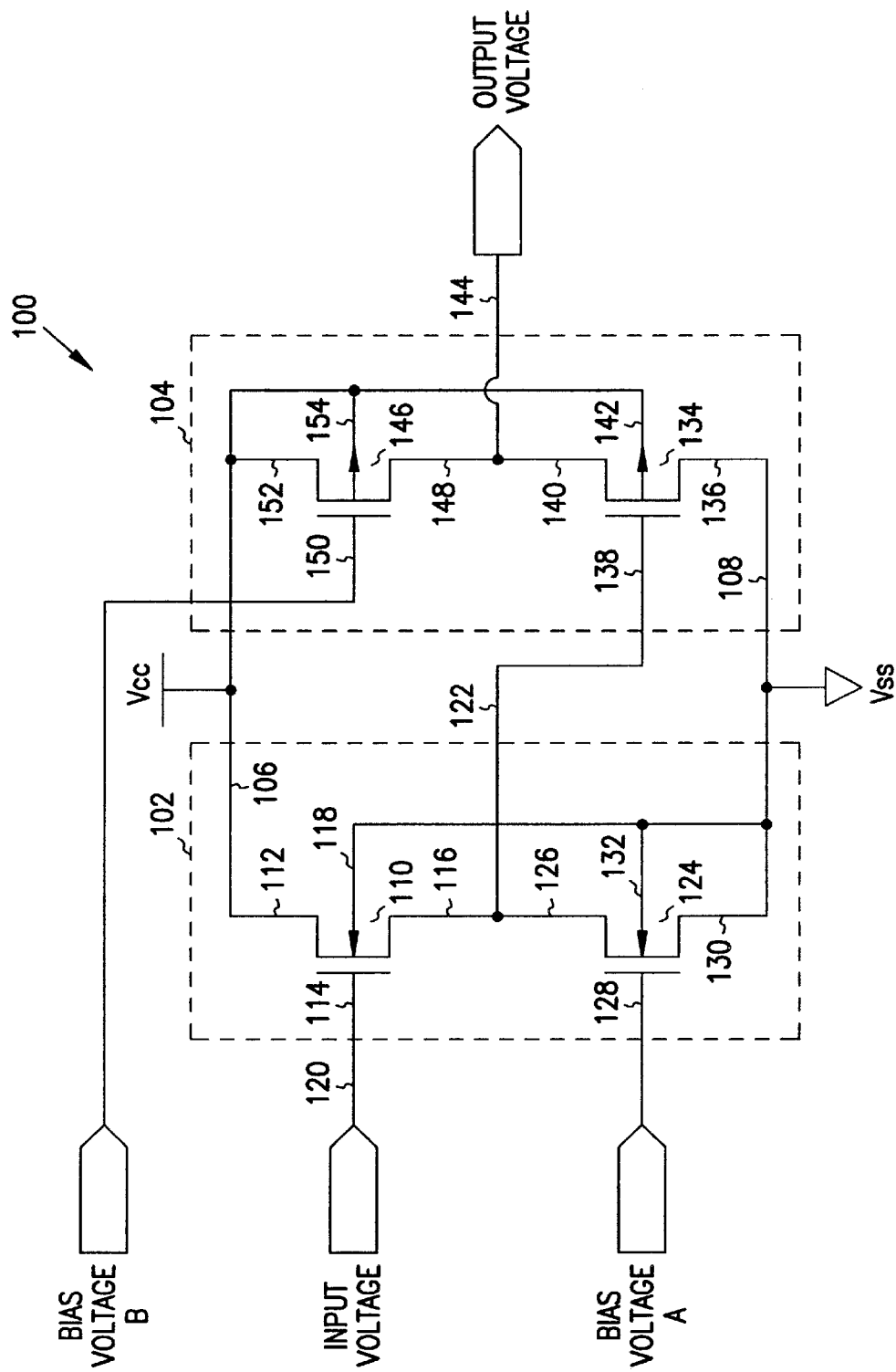
FIG. 1 is a schematic diagram example of a voltage buffer.

FIG. 1 is a schematic diagram example of a voltage buffer 100. In this example, two-stage buffer 100 includes a first stage 102 buffer cascaded with a second stage 104 buffer. Buffer 100 includes a more positive power supply node 106, at a node voltage referred to as $V_{CC}$, and a relatively less positive power supply node 108, at a node voltage referred to as $V_{SS}$. First stage 102 includes an n-channel field-effect transistor (FET) 110. FET 110 includes a drain 112, a gate 114, a source 116, and a body 118. A FET body terminal includes a semiconductor region (e.g., substrate or well diffusion) between its source and drain regions and underlying its gate. Drain 112 is coupled to $V_{CC}$ at node 106. Gate 114 is coupled to receive, at node 120, an input voltage to be buffered. Source 116 provides an output signal, at node 122, of FET 110. Body 118 is coupled to $V_{SS}$ at node 108. FET 110 is referred to as a source-follower, because it is configured with gate 114 receiving an input voltage, source 116 providing an output voltage, and drain 112 and body 118 coupled to respective bias voltages. In this example, first stage 102 also includes an n-channel load FET 124 (or a resistor). Load FET 124 includes a drain 126, a gate 128, a source 130, and a body 132. Drain 126 is coupled to the first stage 102 output at node 122. Gate 128 is coupled to receive bias voltage A, which generally operates FET 124 in its saturation region. Source 130 and body 132 are coupled to $V_{SS}$ at node 108.

In this example, second stage 104 includes a p-channel FET 134 configured as a source-follower. FET 134 includes a drain 136, a gate 138, a source 140, and a body 142. Drain 136 is coupled to $V_{SS}$ at node 108. Gate 138 is coupled to an intermediate voltage provided by the first stage 102 output at node 122. Source 140 provides, at node 144, a buffered output voltage. In this example, body 142 is coupled to $V_{CC}$ at node 106. Second stage 104 also includes a p-channel load FET 146 (or a resistor). Load FET 146 includes a drain 148, a gate 150, a source 152, and a body 154. Drain 148 is coupled to the second stage 104 output at node 144. Gate 150 is coupled to receive a bias voltage B, which generally operates FET 146 in its saturation region. Source 152 and body 154 are coupled to $V_{CC}$ at node 106.

In one example of operation, buffer 100 provides the high input impedance of gate 114 for receiving, without loading down, an input voltage at node 120 (such as from a precision reference voltage generator capable of generating a precise reference voltage, but which does not have large enough current drive capability or small enough output impedance to both maintain this reference voltage at a stable value and provide it as an input to various other load circuits). Buffer 100 provides an output voltage, at node 144, which is based on the precise input voltage at node 120. However, buffer 100 is more capable of driving other circuits needing to use the reference voltage.

By appropriate selection of the bias currents and the width and length dimensions of the FETs in buffer 100, a near-unity dc transfer function is obtained. Alternatively, the output dc voltage at node 144 can be offset from the input voltage at node 120 by appropriate scaling of the width and length dimensions of the FETs.

Moreover, if the reference voltage provided at node 120 to the input of buffer 100 is referenced to $V_{CC}$ at node 106, then buffer 100 advantageously provides an output voltage at node 144 that is also referenced to $V_{CC}$, since it is translated in a first direction from the input voltage by the gate-source voltage drop of n-channel FET 110, and then translated in a second direction, opposite to the first direction, by the gate-source voltage increase of p-channel FET 134. More particularly, $V_{144}=V_{120}-|Vgs_{110}|+|Vgs_{134}|$, where $V_{144}$ is the voltage at output node 144, $V_{120}$ is the voltage at input node 120, $|Vgs_{110}|$ is the gate-source voltage drop magnitude of FET 110, and $|Vgs_{134}|$ is the gate-source voltage increase magnitude of FET 134. As a result of this referencing scheme, power supply noise variations of $V_{CC}$ at node 106 are substantially passed through to the output voltage at node 144, thereby providing a stable voltage difference between output node 144 and $V_{CC}$ at node 106. Conversely, because the output voltage at node 144 is effectively referenced to the power supply voltage $V_{CC}$ at node 106, the output voltage at node 144 is substantially immune to power supply variations of $V_{SS}$ at node 108.

The small-signal output conductance of buffer 100 is approximated by the sum of the small-signal output conductance, $gds_{146}$, of load FET 146 and the small signal transconductance, $gm_{134}$, of source-follower FET 134. The output conductance, gds, of a FET is the inverse of the resistance between its drain and source terminals to a small amplitude ac signal. The transconductance, gm, of a FET is the voltage-to-current gain from a small ac signal voltage applied between the gate and source of the FET to a resulting small ac signal current between the drain and source of the FET. Because $gds_{146}<<gm_{134}$, the small-signal output conductance of buffer 100 is further approximated as equal to $gm_{134}$. The output impedance of buffer 100 is therefore approximated by $1/gm_{134}$. By adjusting the bias current through second stage 104 and/or the width and length dimensions of FET 134, the transconductance $gm_{134}$ is increased to obtain a suitably high small-signal output drive current capability and a suitably low small-signal output impedance. This allows buffer 100 to provide the reference voltage output at node 144 to a load, such as, for example, to properly bias a well region in which many other FETs are located.

Figure 2:
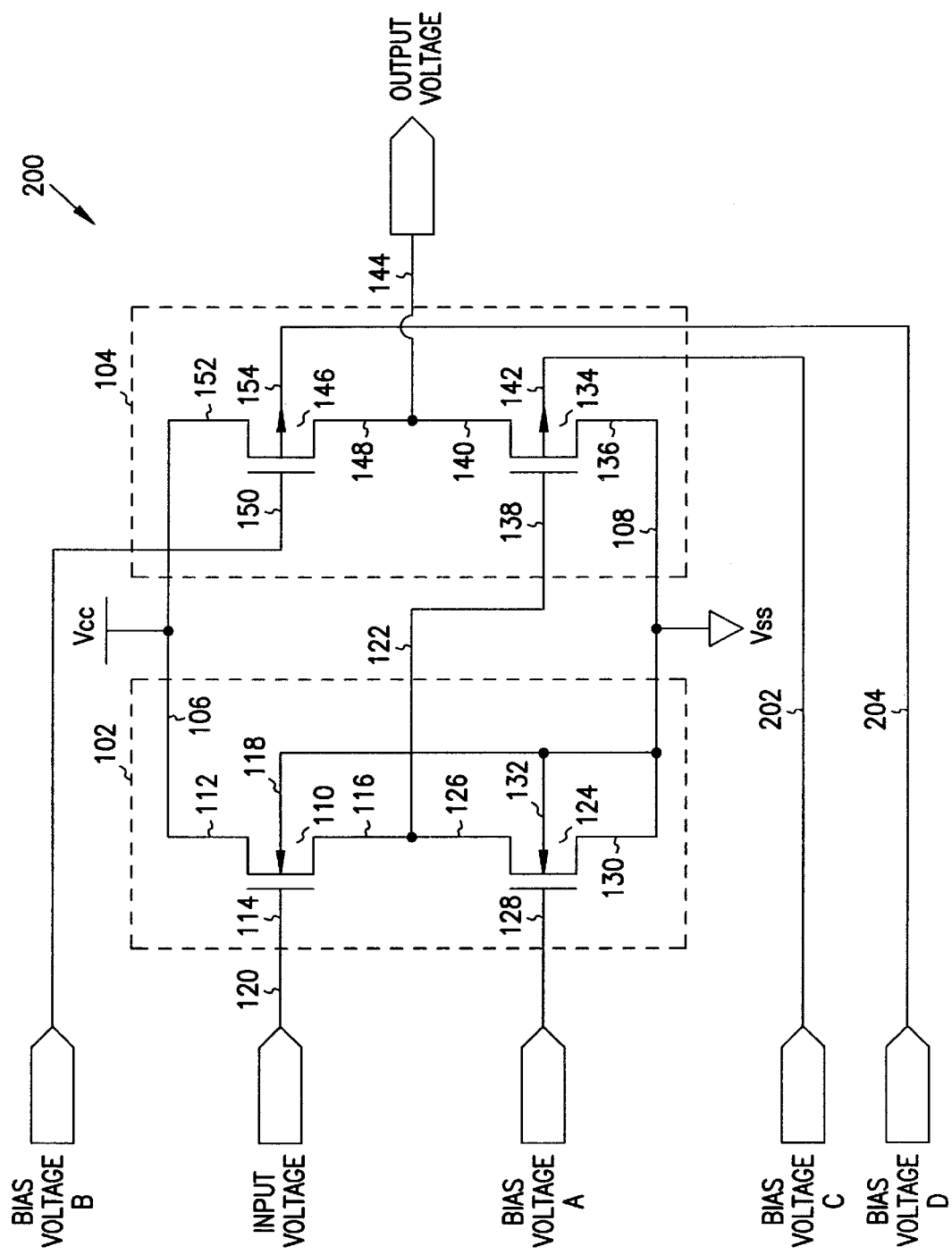
FIG. 2 is a schematic diagram example of a voltage buffer in which the body of one or more of a source follower and/or a load FET is coupled to a forward-biasing bias voltage.

FIG. 2 is a schematic diagram example of a voltage buffer 200 in which the body of one or more of source follower FET 134 and/or load FET 146 is coupled to a forward-biasing bias voltage. In this example, the body of source follower FET 134 is coupled to a forward-biasing bias voltage C at node 202. The value of bias voltage C is selected to maintain a forward-bias condition across the junction between source 140 and body 142 of source follower FET 134. The body of load FET 146 is coupled to a forward-biasing bias voltage D at node 204. The value of bias voltage D is selected to maintain a forward-bias condition across the junction between source 152 and body 154 of load FET 146. In one example, nodes 202 and 204 are tied together to provide the same forward-biasing bias voltage to the bodies of each of source follower FET 134 and load FET 146.

In one example, the p-conductivity type source 140 is approximately 450 millivolts more positive than the n-conductivity type body 142 of source follower FET 134. Forward-biasing the source-body junction of a FET reduces its turn-on threshold voltage. This increases its small-signal transconductance, gm. By decreasing the small-signal transconductance $gm_{134}$ of source-follower FET 134, the output impedance of buffer 200 is reduced relative to that of buffer 100. This provides a more stable output voltage at node 144 as the load current drawn from buffer 200 varies to accommodate the operation of load circuits coupled thereto.

In the example of FIG. 2, p-channel FETs 134 and 146 are fabricated within an n-well that forms the respective bodies 142 and 154 of these transistors. This allows the bias voltage C provided to the bodies 142 and 154 to be set to the desired value. It also allows the semiconductor junction between the n-well and an underlying p-substrate to be maintained in a reverse-bias condition (i.e., the well is at a more positive voltage than the substrate). When the source-body junctions of FETs 134 and 146 are forward-biased, resulting charge carriers are collected by the well, at node 202, which is isolated from the underlying semiconductor substrate by the reverse-biased well-substrate junction.

FIG. 2 illustrates both body 142 of source-follower FET 134 and body 154 of load FET 146 as being connected to corresponding forward-biasing bias voltages C and D, respectively. However, because the output impedance of buffer 200 is predominantly determined by the transconductance $gm_{134}$ of source-follower FET 134, rather than by the output conductance $gds_{146}$ of load FET 146, body 154 of load FET 146 could, in an alternative example, remain coupled to $V_{CC}$ at node 106, such that source follower FET 134, but not load FET 146, is provided a forward-biased source-body junction. Experimental data indicates, however, that when the drain current magnitude, $|Id_{146}|$, of load FET 146 is increased by forward-biasing the junction between source 152 and body 154, while preserving the same value of bias voltage B in the configuration of FIG. 2 as for the configuration of FIG. 1, the small-signal output conductance $gds_{146}$ of load FET 146 increases, thereby further reducing the output impedance of buffer 200 relative to that of buffer 100.

Figure 3:
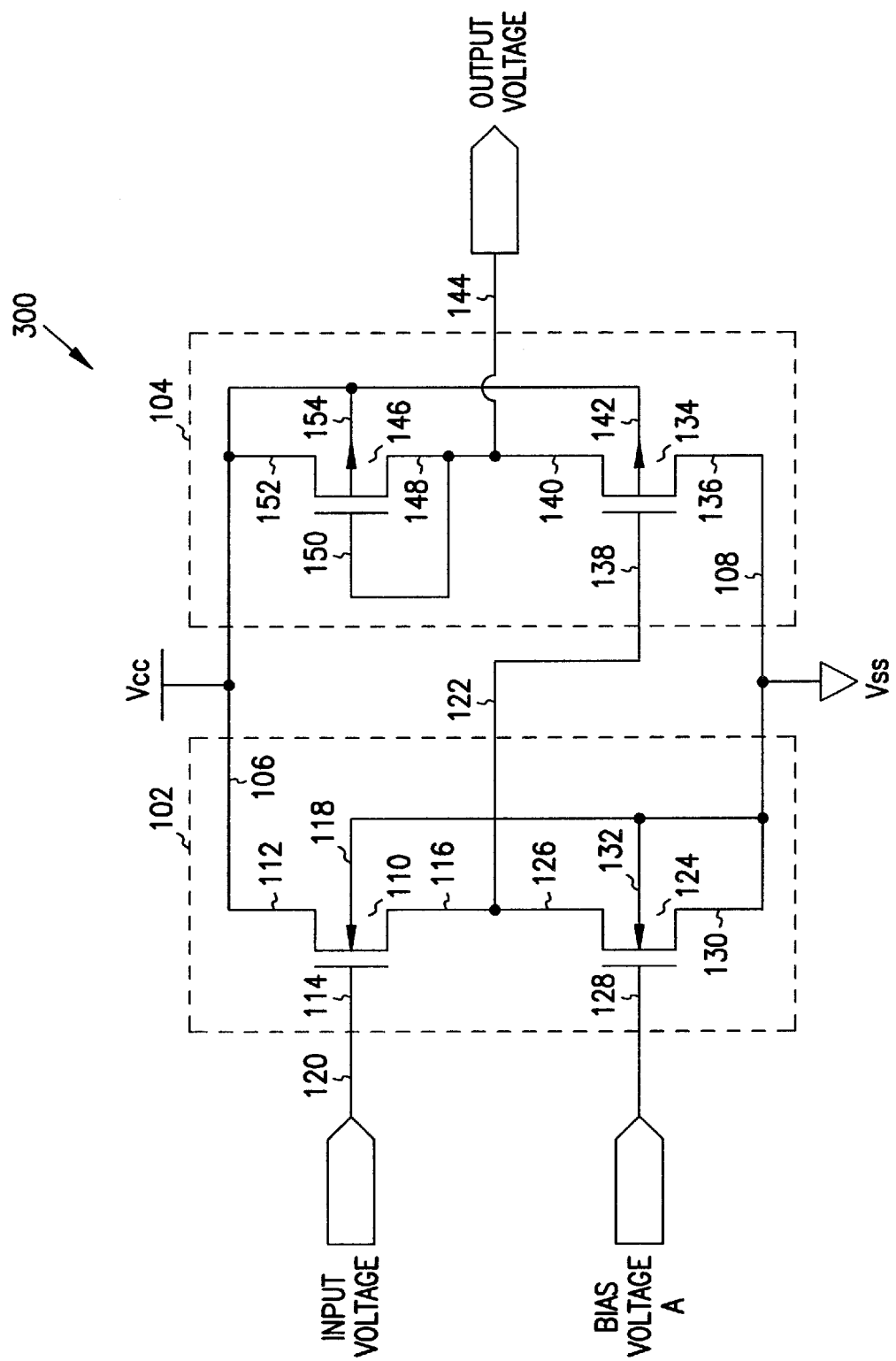
FIG. 3 is a schematic diagram example of a voltage buffer in which a load FET is diode-connected.

FIG. 3 is a schematic diagram example of a voltage buffer 300 in which load FET 146 is diode-connected, that is, gate 150 is coupled to drain 148 at output node 144. This eliminates the need for providing a separate bias voltage B to gate 150 of load FET 146. This diode-connected configuration of load FET 146 also provides load FET 146 with an effective small-signal output conductance of $gm_{146}$, making the overall small-signal output impedance of buffer 300 approximately equal to $1/(gm_{142}+gm_{146})$. Therefore, buffer 300 generally provides a lower small-signal output impedance than buffer 100, which, as discussed above, results in a more stable output voltage at node 144. In this example, body 142 of source follower FET 134 and body 154 of load FET 146 are not forward-biased, but are instead each coupled to $V_{CC}$ at node 106.

Figure 4:
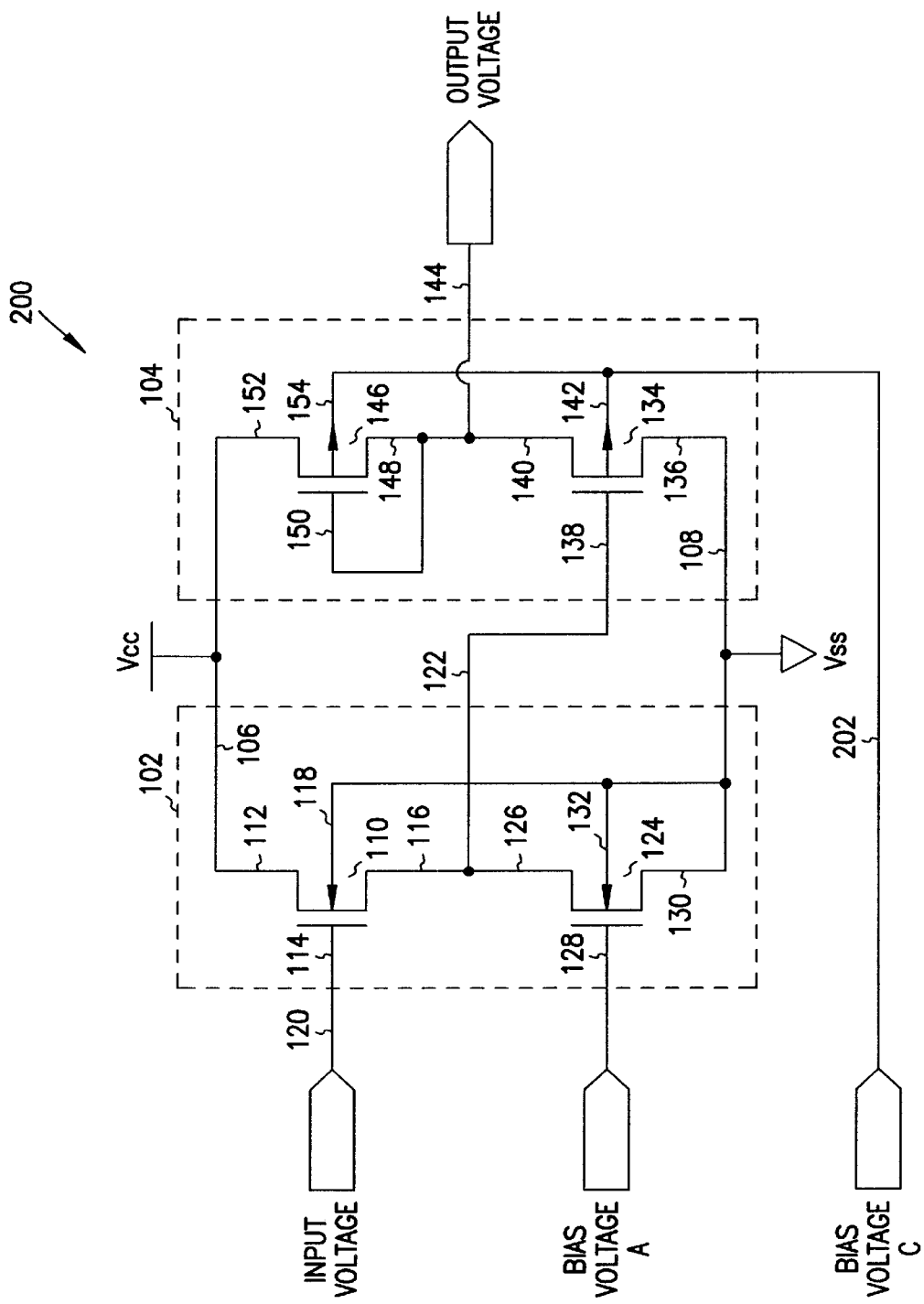
FIG. 4 is a schematic diagram example of a voltage buffer in which a load FET is diode-connected, and in which bodies of a source follower FET and a load FET are coupled to a forward-biasing bias voltage.

FIG. 4 is a schematic diagram example of a voltage buffer 400 in which load FET 146 is diode-connected, and in which bodies 142 and 154, of source follower FET 134 and load FET 146, respectively, are coupled to a forward-biasing bias voltage. In this example, bodies 142 and 154 are coupled to a forward-biasing bias voltage C at node 202 (however, the bodies of source follower FET 134 and load FET 146 can alternatively be individually coupled to different bias voltages, analogous to the illustration of FIG. 2). As discussed above, the diode-connection increases the small signal output conductance presented by load FET 146, which, in turn, provides a reduced overall output impedance of buffer 400 that is approximated by $1/(gm_{142}+gm_{146})$. Moreover, as also discussed above, the forward-biasing of bodies 142 and 154 with respect to respective sources 140 and 152 increases the small-signal transconductances $gm_{142}$ and $gm_{146}$, thereby decreasing the overall output impedance of buffer 400.

In the examples of FIGS. 1–4, it is understood that the voltage buffers 100, 200, 300, or 400 could alternatively be configured to receive an input reference voltage, at node 120, that is referenced to $V_{SS}$ rather than $V_{CC}$. This is accomplished by interchanging first stage 102 and second stage 104. In such an example, FET 134 would constitute the first source-follower FET, receiving the input voltage at its gate 138, and providing an intermediate voltage at its source 140. This intermediate voltage would be received by gate 114 of second-source follower FET 110 which, in turn, would provide the output voltage at its source 116 to the load circuit(s).

Figure 5:
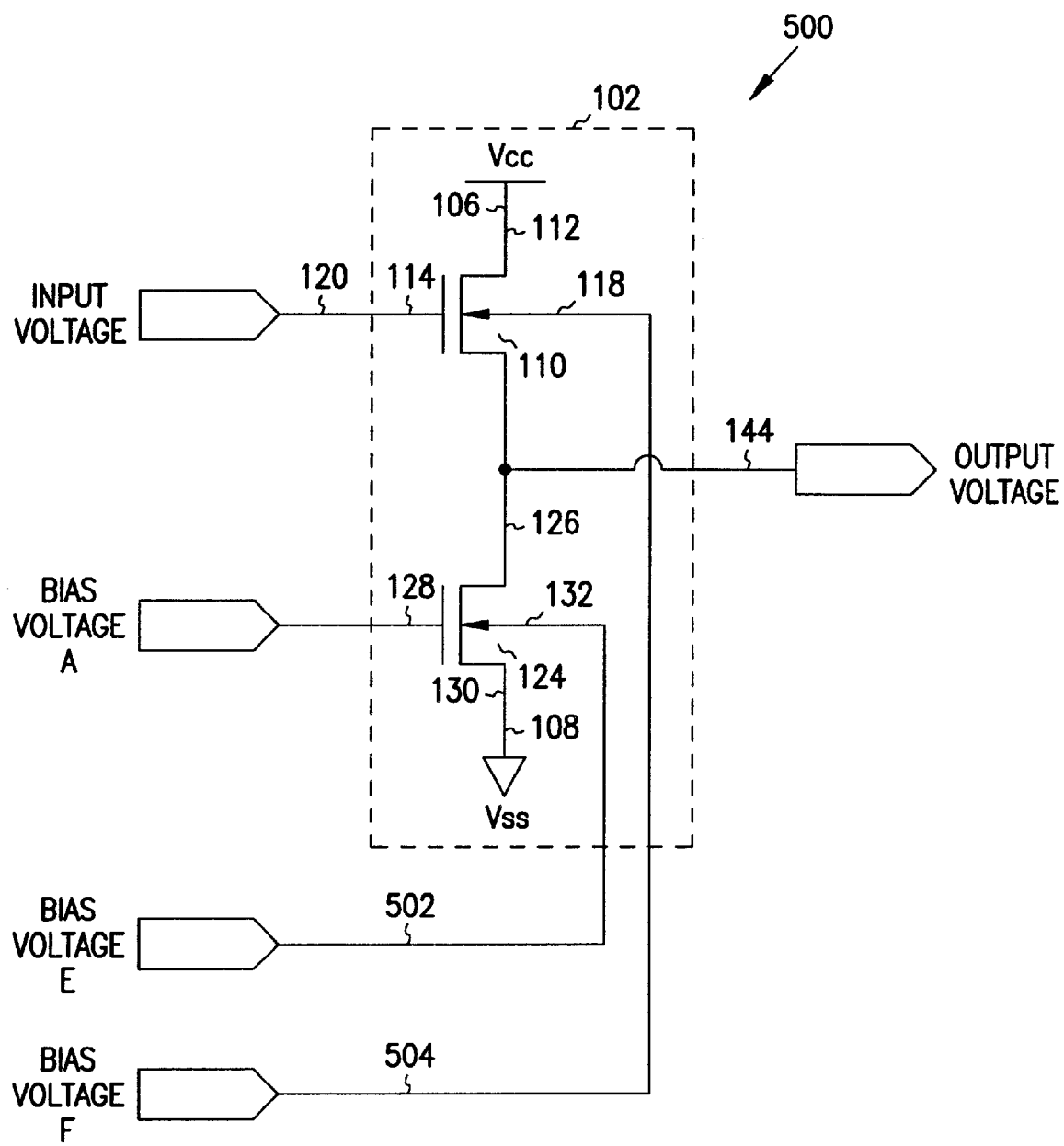
FIG. 5 is a schematic diagram example of a single-stage voltage buffer in which at least one of the bodies of a source follower FET and a load FET are coupled to a forward-biasing bias voltage.

FIG. 5 is a schematic diagram example of a single-stage voltage buffer 500 in which at least one of bodies 118 and 132, of source follower FET 110 and load CFET 124, respectively, are coupled to a forward-biasing bias voltage. In this example, the body of source follower FET 110 is coupled to a forward-biasing bias voltage E at node 502. The value of bias voltage E is selected to maintain a forward-bias condition across the junction between source 116 and body 118 of source follower FET 110. The body of load FET 124 is coupled to a forward-biasing bias voltage F at node 504. The value of bias voltage F is selected to maintain a forward-bias condition across the junction between source 130 and body 132 of load FET 124. In one example, nodes 502 and 504 are tied together to provide the same forward-biasing bias voltage to the bodies of each of source follower FET 110 and load FET 124. FIG. 5 illustrates a single-stage voltage buffer 500 referenced to $V_{CC}$, however, in an alternate example, a single-stage voltage buffer is referenced to $V_{SS}$, such as by using the second stage 104 of buffer 200 with node 122 receiving the input voltage.

Figure 6:
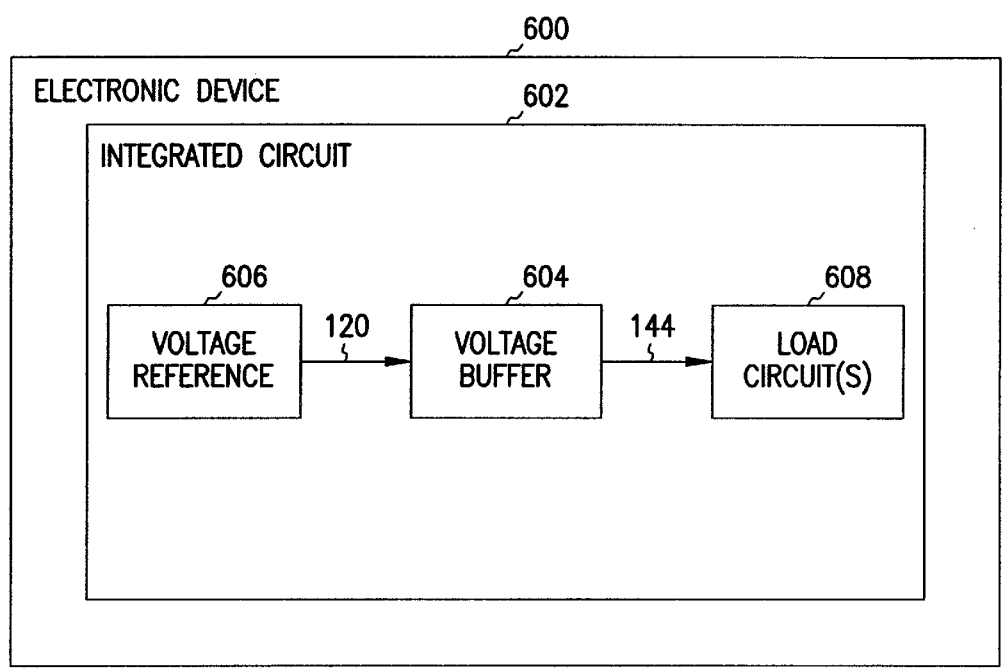
FIG. 6 is a block diagram example of an electronic device including an integrated circuit that includes a voltage buffer.

FIG. 6 is a block diagram example of an electronic device 600 including an integrated circuit 602 that includes a voltage buffer 604, such as one of buffers 100, 200, 300, 400, or 500, or their equivalents. In this example, device 600 includes a computer, communication device, personal digital assistant (PDA) or other electronic device. Integrated circuit 602 includes a processor, communication circuit, or other integrated circuit. In this example, buffer 604 receives a reference voltage, at node 120, from a voltage reference circuit 606, and provides a buffered output voltage, at node 144, to one or more load circuits 608.

Figure 7:
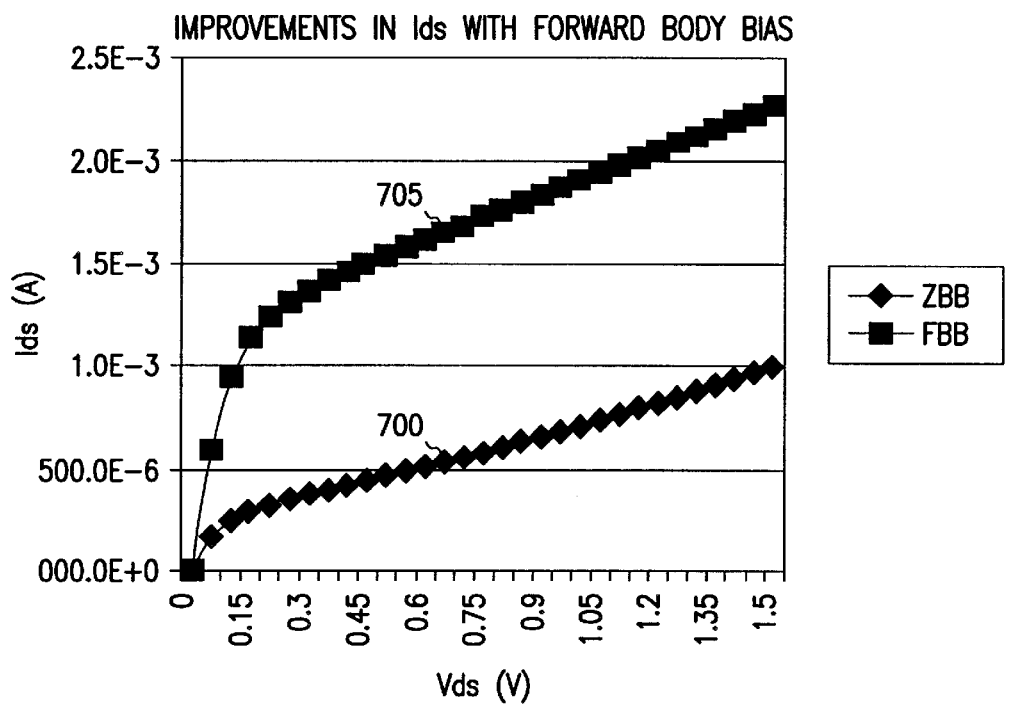
FIG. 7 is a graph example of experimental data of drain-source current magnitude ($|Ids|$) vs. drain-source voltage magnitude ($|Vds|$) of a FET for a particular value of gate-source voltage magnitude ($|Vgs|$).
Figure 8:
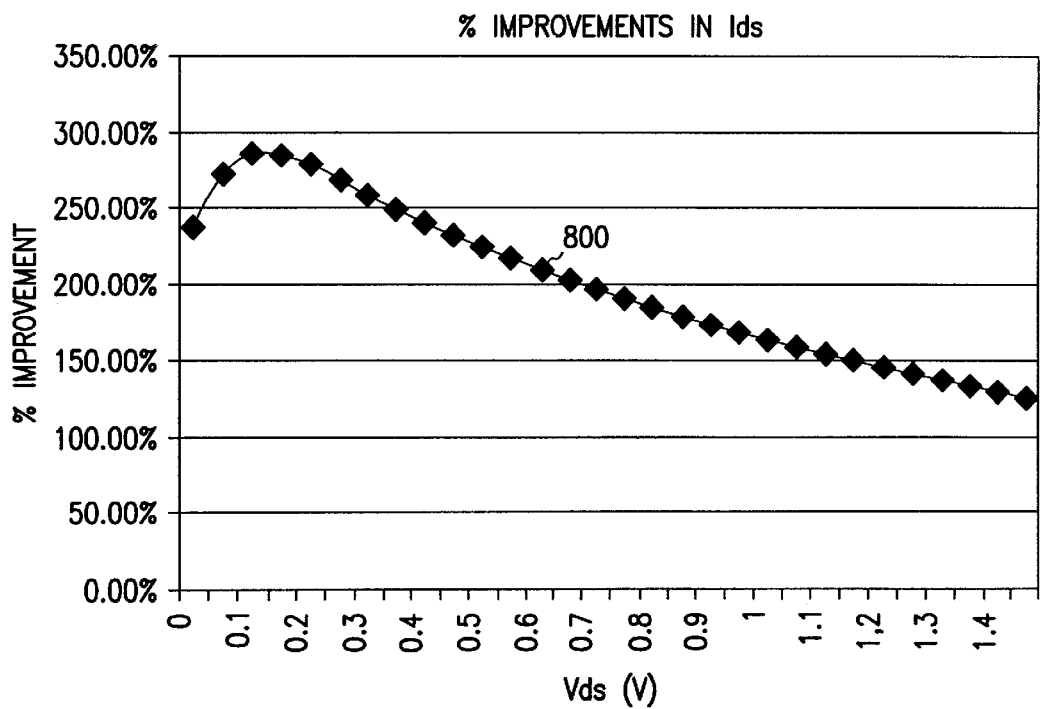
FIG. 8 is a corresponding graph example of data illustrating the percent increase in Ids obtained by source-body forward-biasing.
Figure 9:
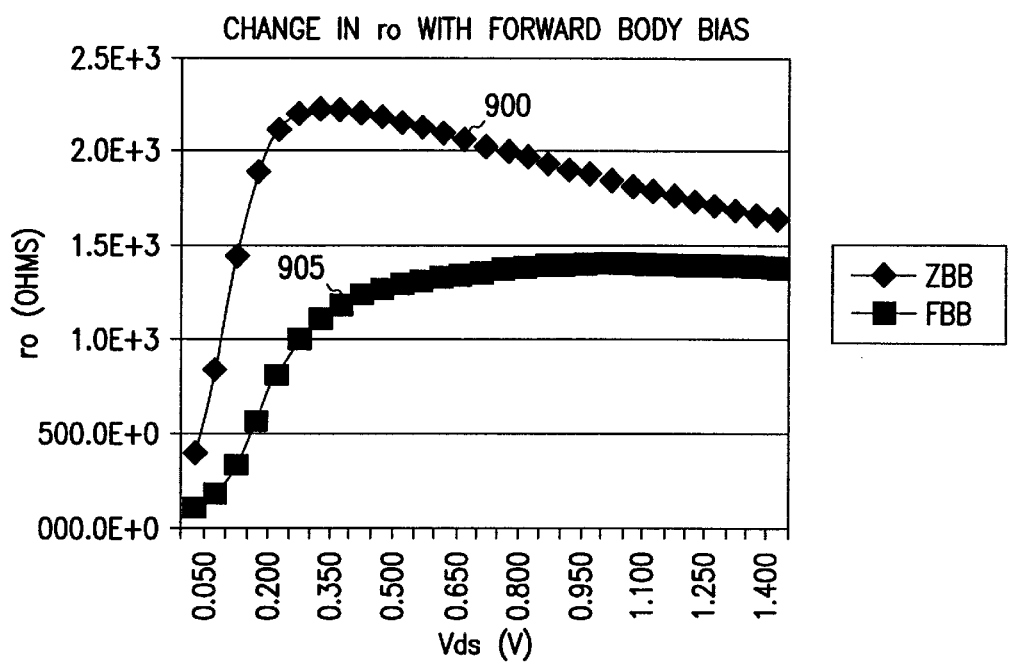
FIG. 9 is a corresponding graph example of data of small-signal output resistance $r_o$ vs. $|Vds|$.
Figure 10:
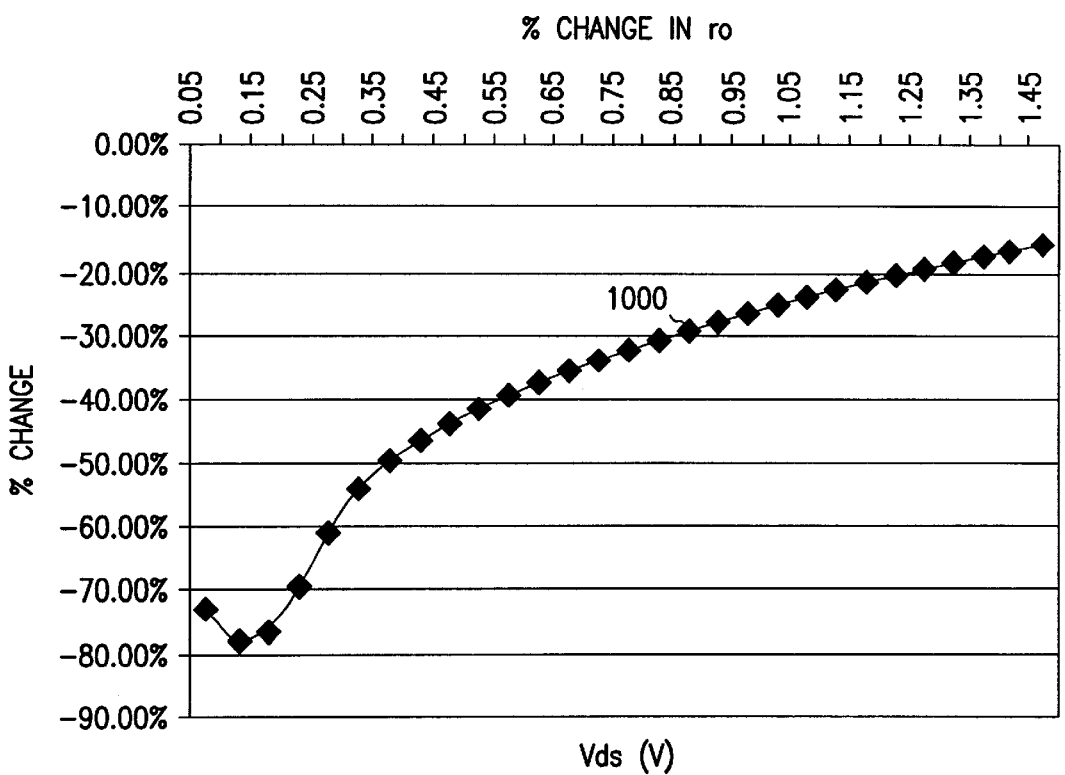
FIG. 10 is a corresponding graph example of data illustrating the percent decrease in $r_o$ resulting from applying a source-body forward-bias.

FIG. 7 is a graph example of experimental data of drain-source current magnitude ($|Ids|$) vs. drain-source voltage magnitude ($|Vds|$) of a short channel-length n-channel FET for a particular value of gate-source voltage magnitude ($|Vgs|$), such as, for example, $|Vgs|=0.4$ Volts. In this example, data 700 represents a FET biased with zero volts between its source and body terminals. Data 705 represents a FET with about 450 millivolts of forward-bias voltage between its source and body. FIG. 8 is a corresponding graph example of data 800 illustrating the percent increase in $|Ids|$ obtained by using this value of forward-bias voltage between source and body of the FET. FIG. 9 is a corresponding graph example of experimental data of small-signal output resistance $r_o$ ($=1/g_{ds}$) vs. $|Vds|$. Data 900 illustrates zero source-body bias, and data 905 illustrates about 450 millivolts of source-body forward-biasing. FIG. 10 is a corresponding graph example of data 1000 illustrating the percent decrease in $r_o$ resulting from applying a source-body forward-bias.

Although FIGS. 9 and 10 show that $r_o$ decreases when forward-biasing is applied, such decreased $r_o$ is accompanied by the corresponding increase in $|Ids|$ illustrated in FIG. 7. When the drain-source bias current $|Ids|$ of the FET with the forward-biased source-body is decreased to the same value as a FET with zero-biased source-body, the small-signal output impedance $r_o$ is larger for the FET with the forward-biased source-body than for the FET with zero-biased source-body. For example, where the $|Vgs|$ of the FET with the forward-biased source-body is decreased from 0.4 V to 0.266 V to match its $|Ids|$ to the $|Ids|$ of the FET with the zero-biased source-body, the $r_o$ of the FET with the forward-biased source-body increases from 0.573 kΩ to 6.6 kΩ. This is about a 1225% increase, which is useful when the FET is used as a load device in an amplifying voltage buffer, i.e., providing a larger than unity small-signal voltage gain, which is proportional to the product between the small-signal transconductance of a driving FET and the $r_o$ of the load FET.

Figure 11:
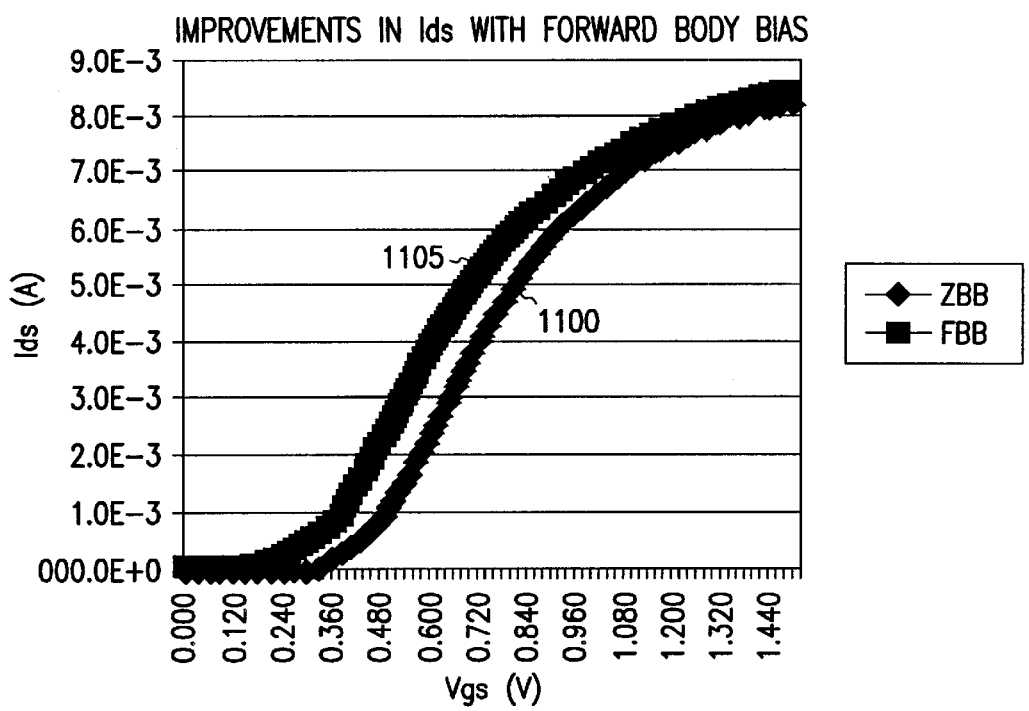
FIG. 11 is a graph example of experimental data of $|Ids|$ vs. $|Vgs|$ of a FET for a particular value of $|Vds|$.
Figure 12:
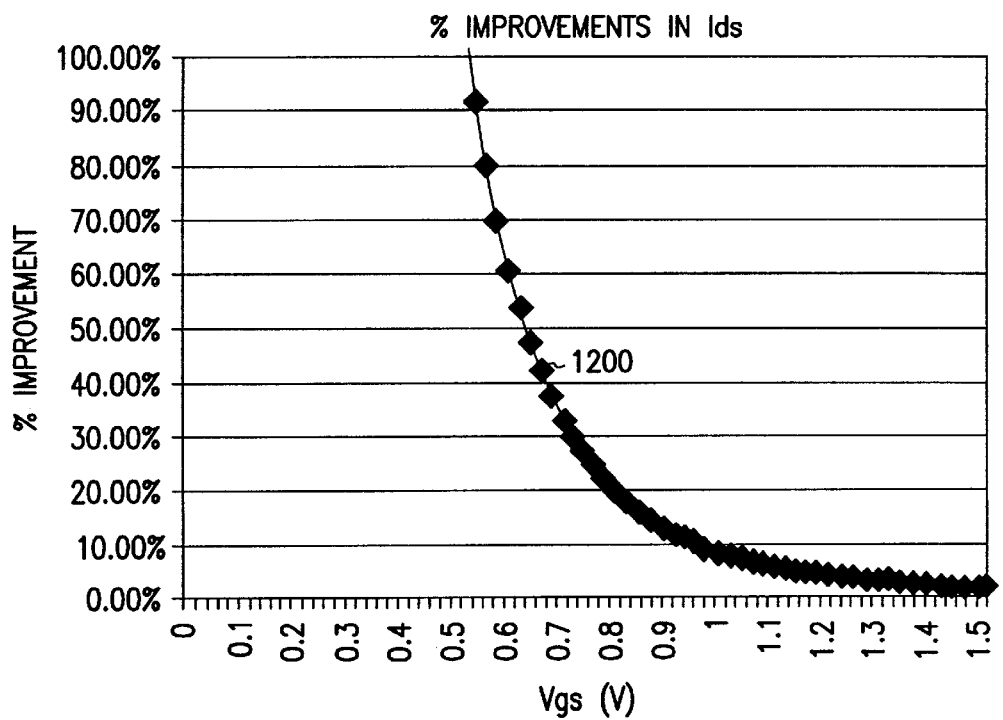
FIG. 12 is a corresponding graph example of data illustrating the percent increase in Ids obtained by source-body forward-biasing.
Figure 13:
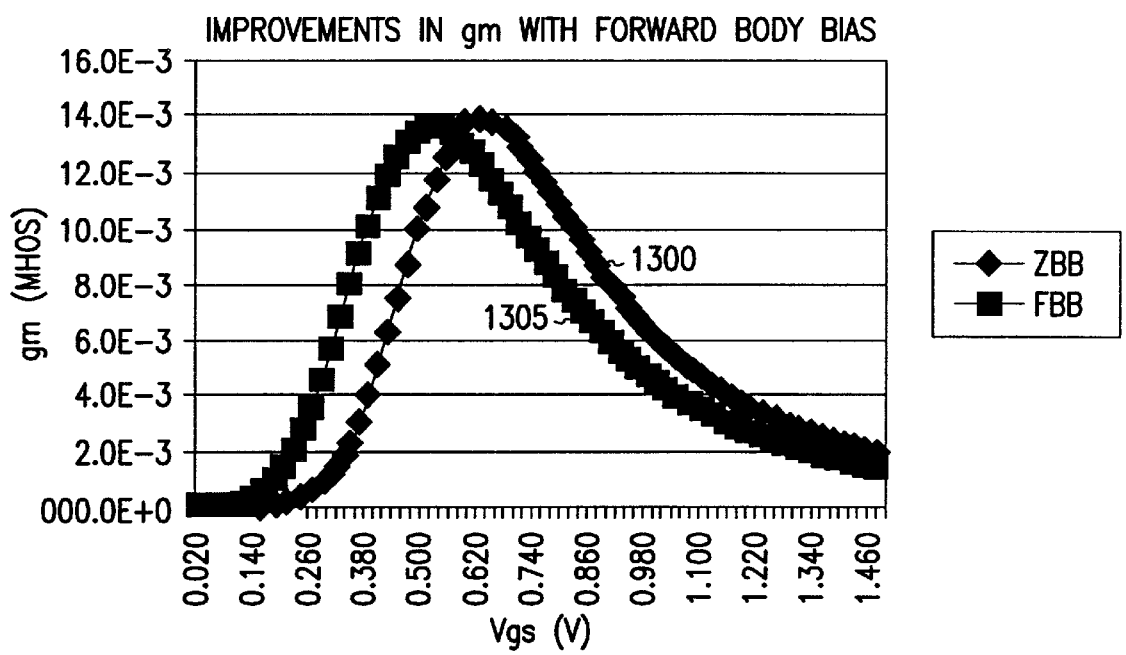
FIG. 13 is a corresponding graph example of experimental data of small-signal transconductance $g_m$ vs. $|vgs|$.
Figure 14:
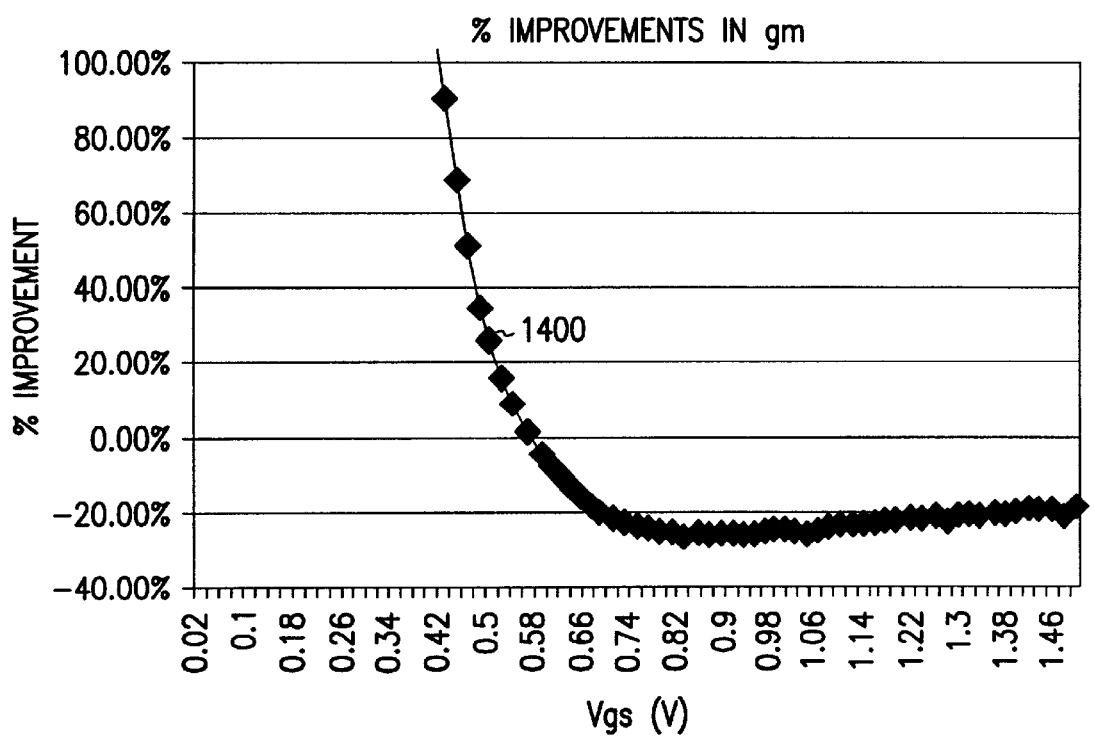
FIG. 14 is a corresponding graph example of data illustrating the percent increase in $g_m$ resulting from applying a source-body forward-bias.

FIG. 11 is a graph example of experimental data of |Ids| vs. |Vgs| of a FET for a particular value of |Vds|, such as, for example, |Vds|=0.2V. In this example, data 1100 represents a FET with zero source-body bias. Data 1105 represents a FET with about 450 millivolts of source-body forward-bias. FIG. 12 is a corresponding graph example of data 1200 illustrating the percent increase in |Ids| obtained by using this value of source-body forward-biasing. FIG. 13 is a corresponding graph example of experimental data from the FET of small-signal transconductance $g_m$ vs. |Vgs|. In this example, data 1300 represents a FET with zero source-body bias. Data 1305 represents a FET with about 450 millivolts of source-body forward-bias. FIG. 14 is a corresponding graph example of data 1400 illustrating the percent increase in $g_m$ resulting from applying a source-body forward-bias. As illustrated in FIGS. 11–14, at |Vds|=0.2V and |Vgs|=0.4V, for example, applying the 450 millivolt source-body forward-biasing increases |Ids| from about 323 microamperes to about 1.2 milliamperes (about a 285% increase) and increases $g_m$ from about 5.1 milliohms$^{-1}$ to about 11.1 milliohms$^{-1}$ (about a 119% increase). As discussed above, this is useful for lowering the output impedance of the buffers illustrated in FIGS. 1–5, which, in turn, provides a more stable output voltage to their respective load circuits. This is also useful when the FET is used as a driving transconductance device in an amplifying voltage buffer, i.e., providing a larger than unity small-signal voltage gain, which is proportional to the product between the small-signal transconductance $g_m$ of the driving transconductor FET and the $r_o$ of a load FET.

Figure 15:
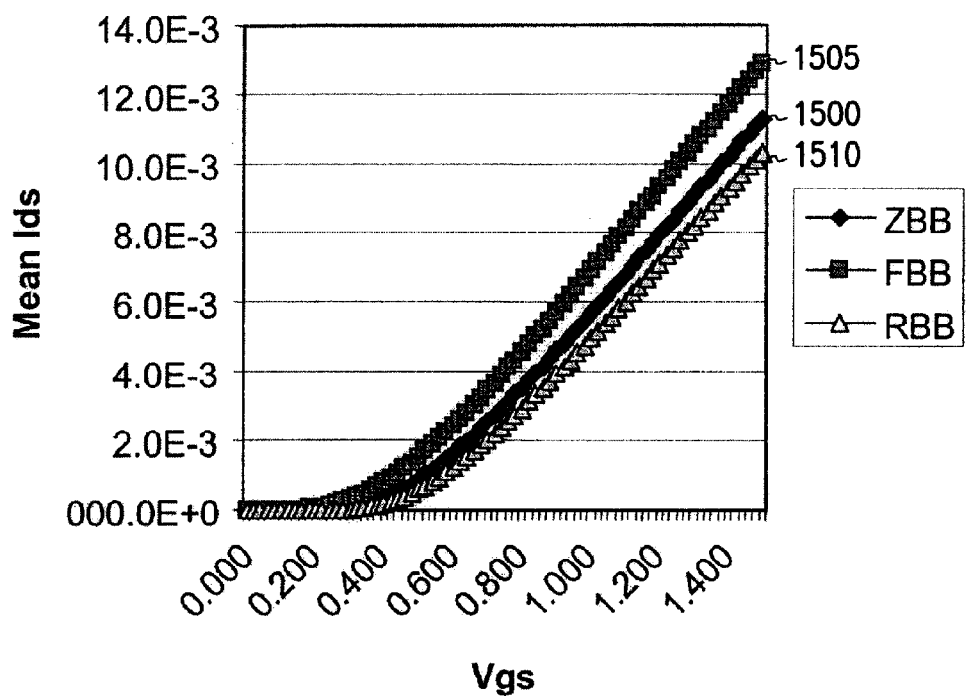
FIG. 15 is a graph example of experimental data of average $|Ids|$ vs. $|Vgs|$ for n=126 p-channel FETs for a particular value of $|Vds|$, such as, for example, $|Vds|=1.5$ V.

FIG. 15 is a graph example of experimental data of average |Ids| vs. |Vgs| for n=126 p-channel FETs for a particular value of |Vds|, such as, for example, |Vds|=1.5 V. In this example, data 1500 represents a FET with zero source-body bias. Data 1505 represents a FET with about 500 millivolts of source-body forward-bias. Data 1510 represents a FET with a reverse-biased source-body junction. In this example, forward-biasing the source-body junction increases the mean |Ids| (at |Vds|=1.5 V) by about 72% as compared to zero-biasing.

Figure 16:
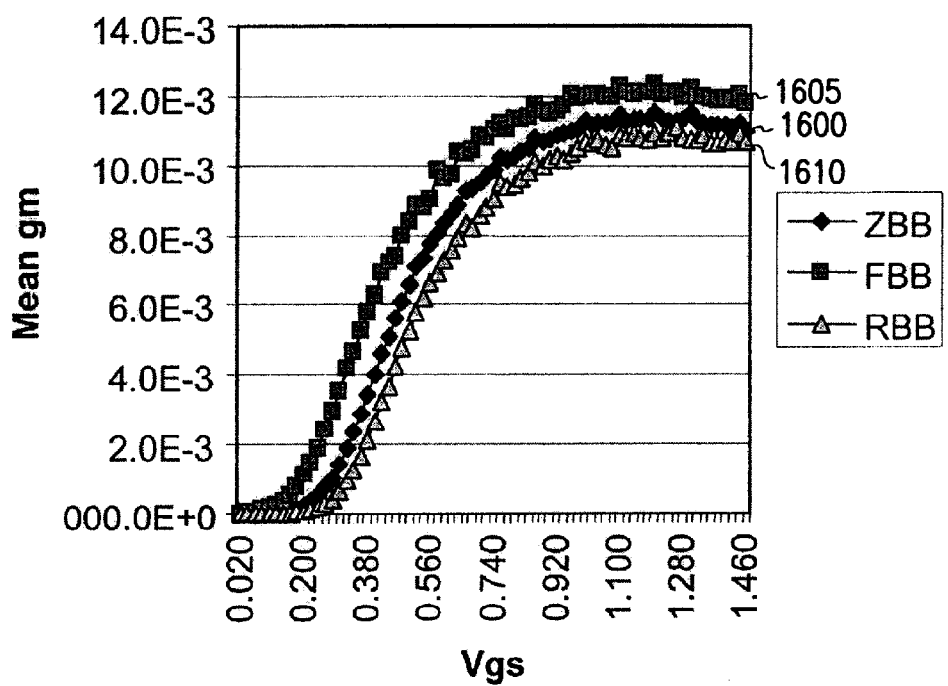
FIG. 16 is a graph example of experimental data of average $g_m$ vs. $|Vgs|$ for n=126 p-channel FETs for a particular value of $|Vds|$, such as, for example, $|Vds|=1.5$ V.

FIG. 16 is a graph example of experimental data of average $g_m$ vs. |Vgs| for n=126 p-channel FETs for a particular value of |Vds|, such as, for example, |Vds|=1.5 V. In this example, data 1600 represents a FET with zero source-body bias. Data 1605 represents a FET with about 500 millivolts of source-body forward-bias. Data 1610 represents a FET with a reverse-biased source-body junction. In this example, forward-biasing the source-body junction increases the mean $g_m$ (at |Vds|=1.5 V) by about 29% as compared to zero-biasing.

Figure 17:
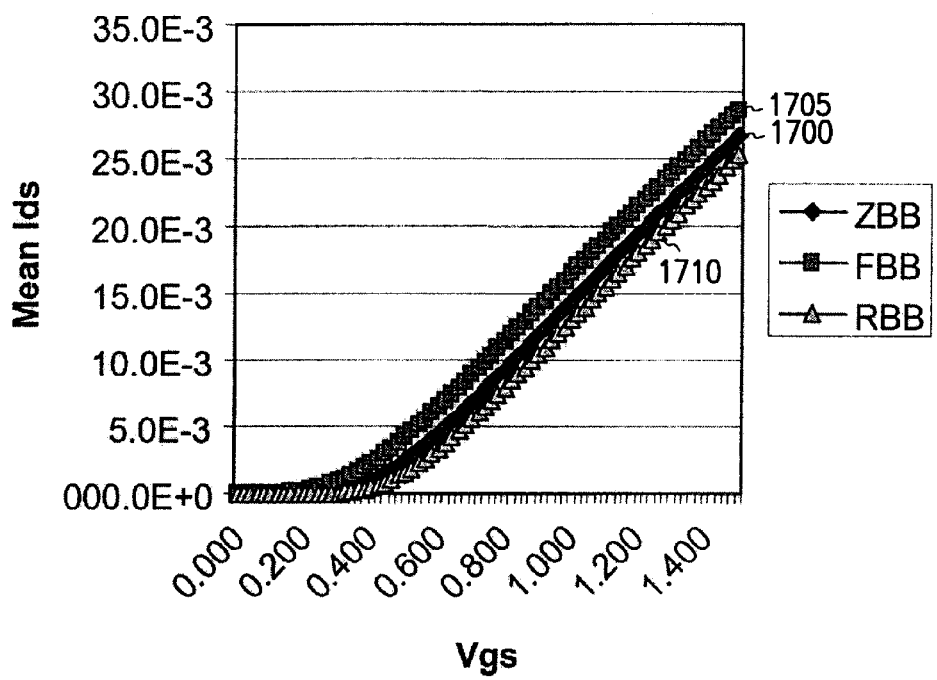
FIG. 17 is a graph example of experimental data of average $|Ids|$ vs. $|Vgs|$ for n=126 n-channel FETs for a particular value of $|Vds|$, such as, for example, $|Vds|=1.5$ V.

FIG. 17 is a graph example of experimental data of average |Ids| vs. |Vgs| for n=126 n-channel FETs for a particular value of |Vds|, such as, for example, |Vds|=1.5 V. In this example, data 1700 represents a FET with zero source-body bias. Data 1705 represents a FET with about 500 millivolts of source-body forward-bias. Data 1710 represents a FET with a reverse-biased source-body junction. In this example, forward-biasing the source-body junction increases the mean |Ids| (at |Vds|=1.5 V) by about 68% as compared to zero-biasing.

Figure 18:
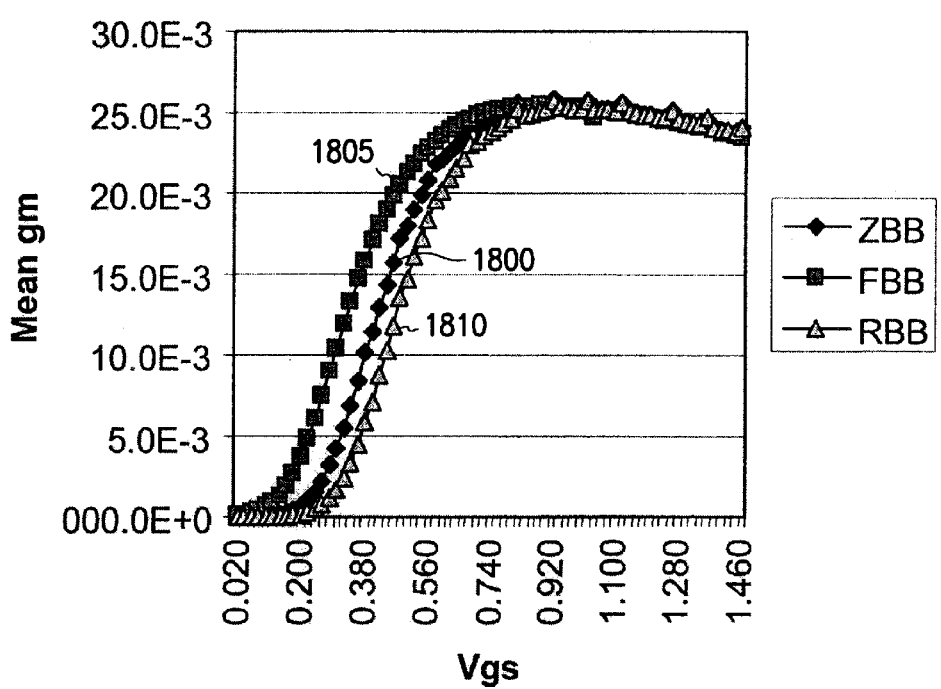
FIG. 18 is a graph example of experimental data of average $g_m$ vs. $|Vgs|$ for n=126 n-channel FETs for a particular value of $|Vds|$, such as, for example, $|Vds|=1.5$ V.

FIG. 18 is a graph example of experimental data of average $g_m$ vs. |Vgs| for n=126 n-channel FETs for a particular value of |Vds|, such as, for example, |Vds|=1.5 V. In this example, data 1800 represents a FET with zero source-body bias. Data 1805 represents a FET with about 500 millivolts of source-body forward-bias. Data 1810 represents a FET with a reverse-biased source-body junction. In this example, forward-biasing the source-body junction increases the mean $g_m$ (at |Vds|=1.5 V) by about 18% as compared to zero-biasing.

Figure 19:
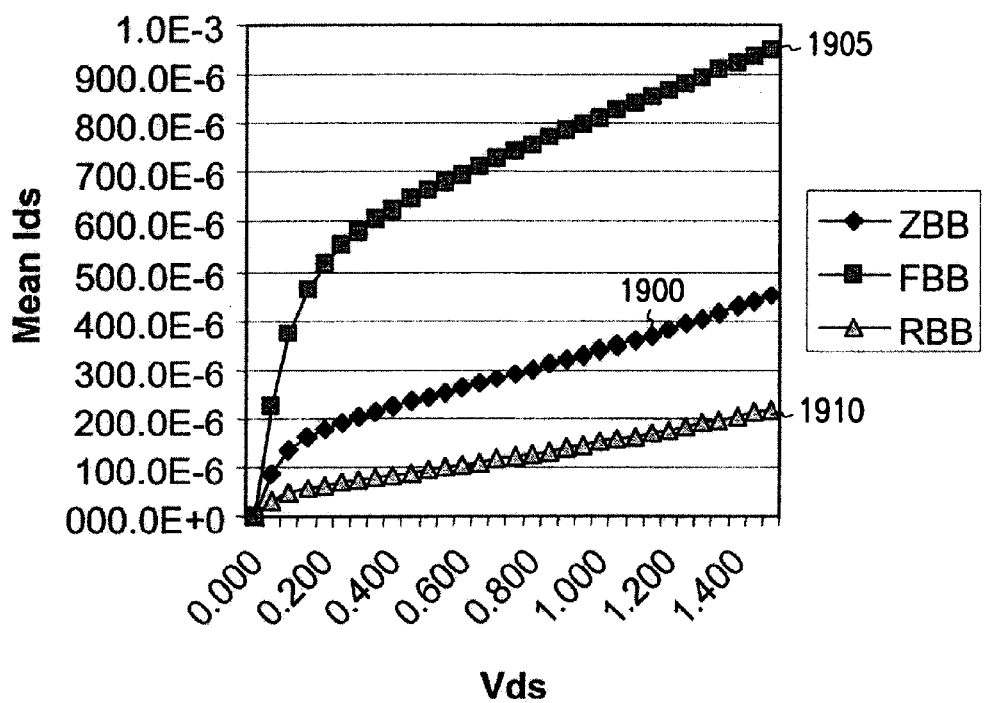
FIG. 19 is a graph example of experimental data of average $|Ids|$ vs. $|Vds|$ for n=126 p-channel FETs for a particular value of $|Vgs|$, such as, for example, $|Vgs|=0.4$ V.

FIG. 19 is a graph example of experimental data of average |Ids| vs. |Vds| for n=126 p-channel FETs for a particular value of |Vgs|, such as, for example, |Vgs|=0.4 V. In this example, data 1900 represents a FET with zero source-body bias. Data 1905 represents a FET with about 500 millivolts of source-body forward-bias. Data 1910 represents a FET with a reverse-biased source-body junction. In this example, forward-biasing the source-body junction increases the mean |Ids| by about 111% (at |Vds|=1.5 V) as compared to zero-biasing.

Figure 20:
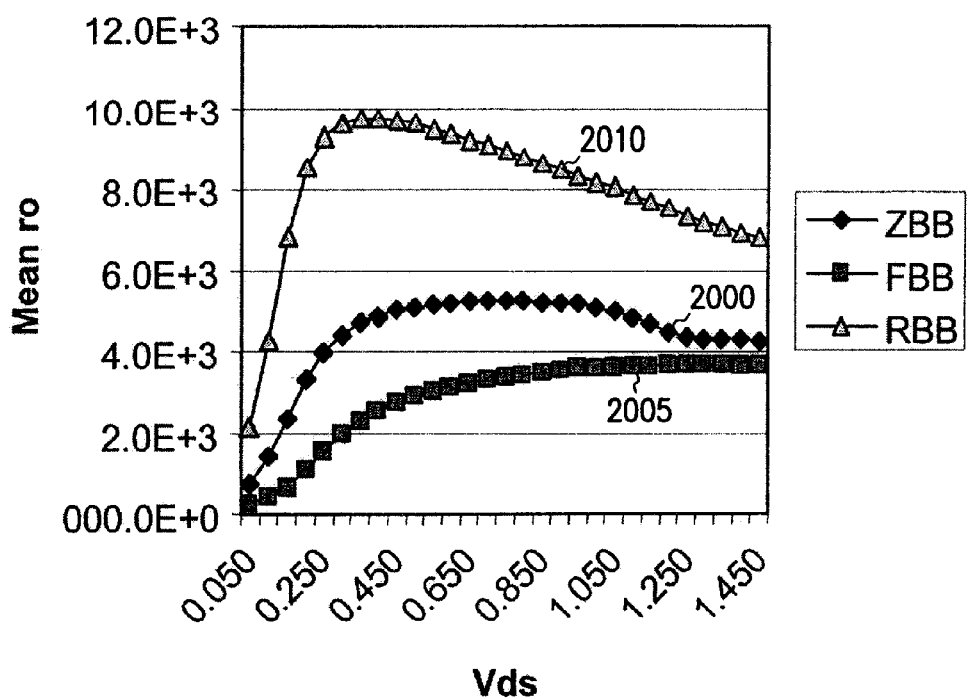
FIG. 20 is a graph example of experimental data of average $r_o$ vs. $|Vds|$ for n=126 p-channel FETs for a particular value of $|Vgs|$, such as, for example, $|Vgs|=0.4$ V.

FIG. 20 is a graph example of experimental data of average $r_o$ vs. |Vds| for n=126 p-channel FETs for a particular value of |Vgs|, such as, for example, |Vgs|=0.4 V. In this example, data 2000 represents a FET with zero source-body bias. Data 2005 represents a FET with about 500 millivolts of source-body forward-bias. Data 2010 represents a FET with a reverse-biased source-body junction. In this example, when compared to zero-biasing at the same value of |Ids|, forward-biasing the source-body junction (at |Vds|=1.5 V) decreases |Vgs| by about 25% and increases the mean $r_o$ by about 111%.

Figure 21:
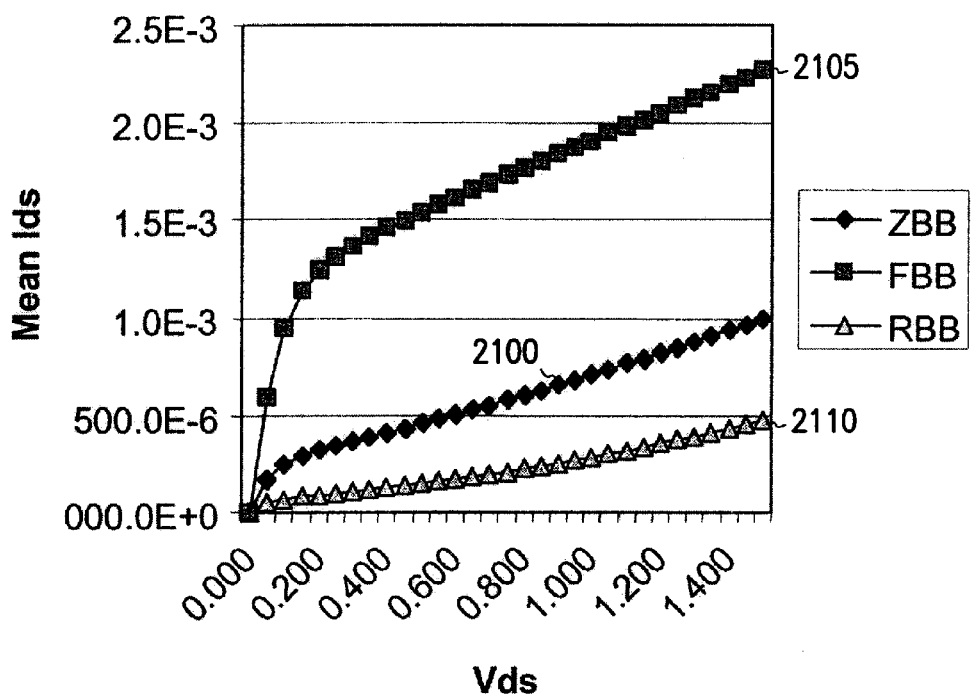
FIG. 21 is a graph example of experimental data of average $|Ids|$ vs. $|Vds|$ for n=126 n-channel FETs for a particular value of $|Vgs|$, such as, for example, $|Vgs|=0.4$ V.

FIG. 21 is a graph example of experimental data of average |Ids| vs. |Vds| for n=126 n-channel FETs for a particular value of |Vgs|, such as, for example, |Vgs|=0.4 V. In this example, data 2100 represents a FET with zero source-body bias. Data 2105 represents a FET with about 500 millivolts of source-body forward-bias. Data 2110 represents a FET with a reverse-biased source-body junction. In this example, forward-biasing the source-body junction increases the mean |Ids| by about 13% (at |Vds|=1.5 V) as compared to zero-biasing.

Figure 22:
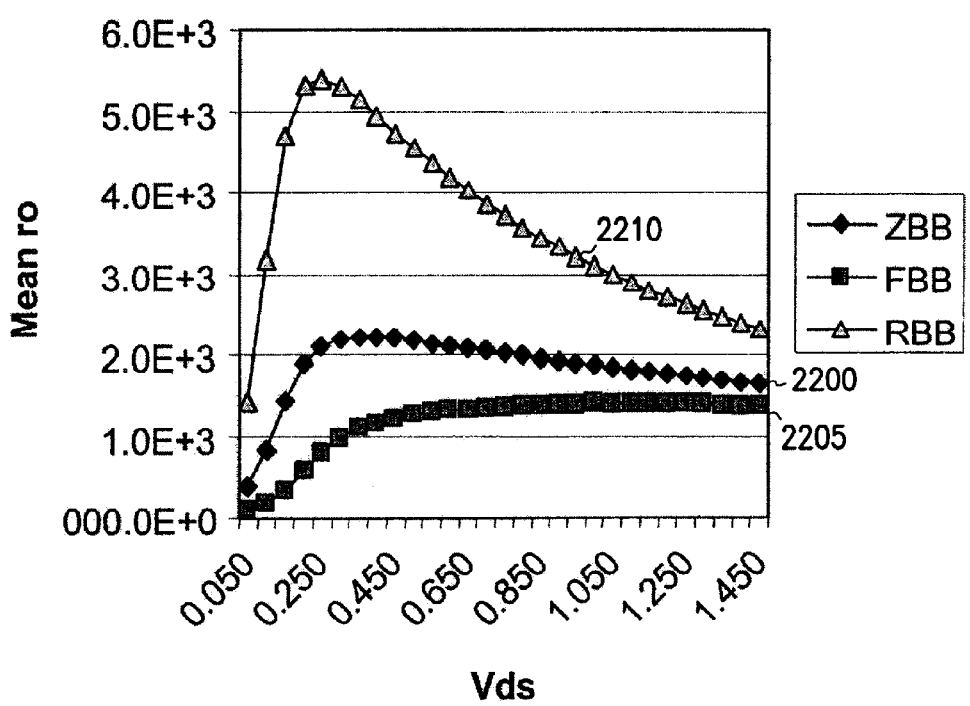
FIG. 22 is a graph example of experimental data of average $r_o$ vs. $|Vds|$ for n=126 n-channel FETs for a particular value of $|Vgs|$, such as, for example, $|Vgs|=0.4$ V.

FIG. 22 is a graph example of experimental data of average $r_o$ vs. |Vds| for n=126 n-channel FETs for a particular value of |Vgs|, such as, for example, |Vgs|=0.4 V. In this example, data 2200 represents a FET with zero source-body bias. Data 2205 represents a FET with about 500 millivolts of source-body forward-bias. Data 2210 represents a FET with a reverse-biased source-body junction. In this example, when compared to zero-biasing at the same value of |Ids|, forward-biasing the source-body junction (at |Vds|=1.5 V) decreases |Vgs| by about 25% and increases the mean $r_o$ by about 140%.

Figure 23:
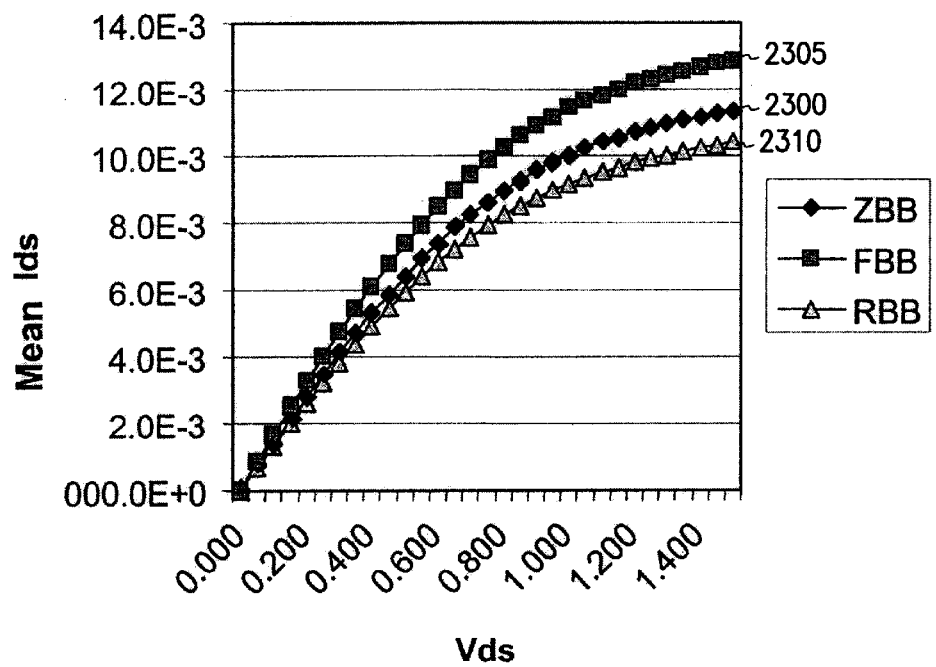
FIG. 23 is a graph example of experimental data of average $|Ids|$ vs. $|Vds|$ for n=126 p-channel FETs for a particular value of $|Vgs|$, such as, for example, $|Vgs|=1.5$ V.

FIG. 23 is a graph example of experimental data of average |Ids| vs. |Vds| for n=126 p-channel FETs for a particular value of |Vgs|, such as, for example, |Vgs|=1.5 V. In this example, data 2300 represents a FET with zero source-body bias. Data 2305 represents a FET with about 500 millivolts of source-body forward-bias. Data 2310 represents a FET with a reverse-biased source-body junction. In this example, forward-biasing the source-body junction increases the mean |Ids| by about 13% (at |Vds|=1.5 V) as compared to zero-biasing.

Figure 24:
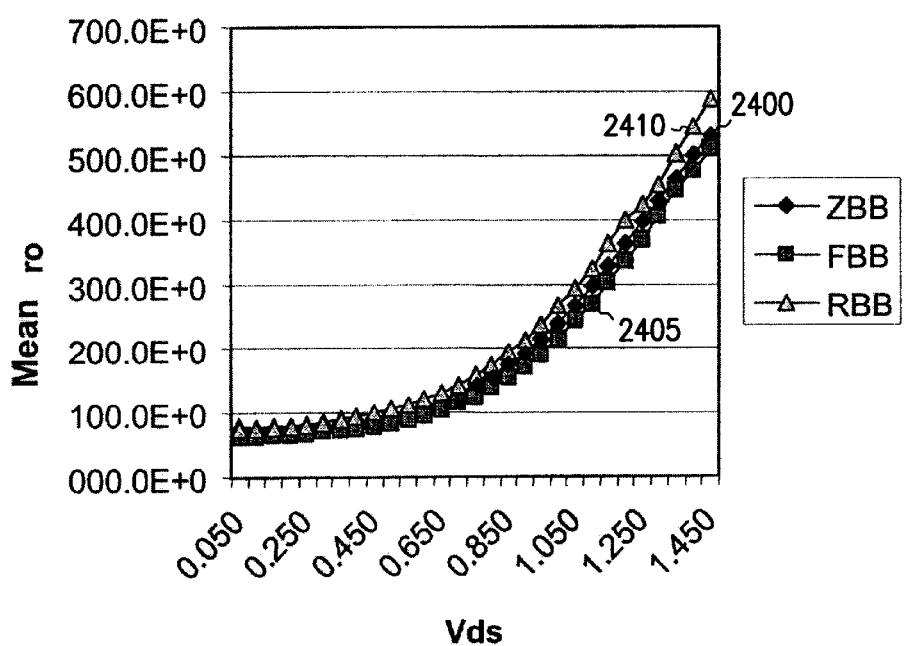
FIG. 24 is a graph example of experimental data of average $r_o$ vs. $|Vds|$ for n=126 p-channel FETs for a particular value of $|Vgs|$, such as, for example, $|Vgs|=1.5$ V.

FIG. 24 is a graph example of experimental data of average $r_o$ vs. |Vds| for n=126 p-channel FETs for a particular value of |Vgs|, such as, for example, |Vgs|=1.5 V. In this example, data 2400 represents a FET with zero source-body bias. Data 2405 represents a FET with about 500 millivolts of source-body forward-bias. Data 2410 represents a FET with a reverse-biased source-body junction. In this example, when compared to zero-biasing at the same value of |Ids|, forward-biasing the source-body junction (at |Vds|=1.5 V) decreases |Vgs| by about 9% and increases the mean $r_o$ by about 18%.

Figure 25:
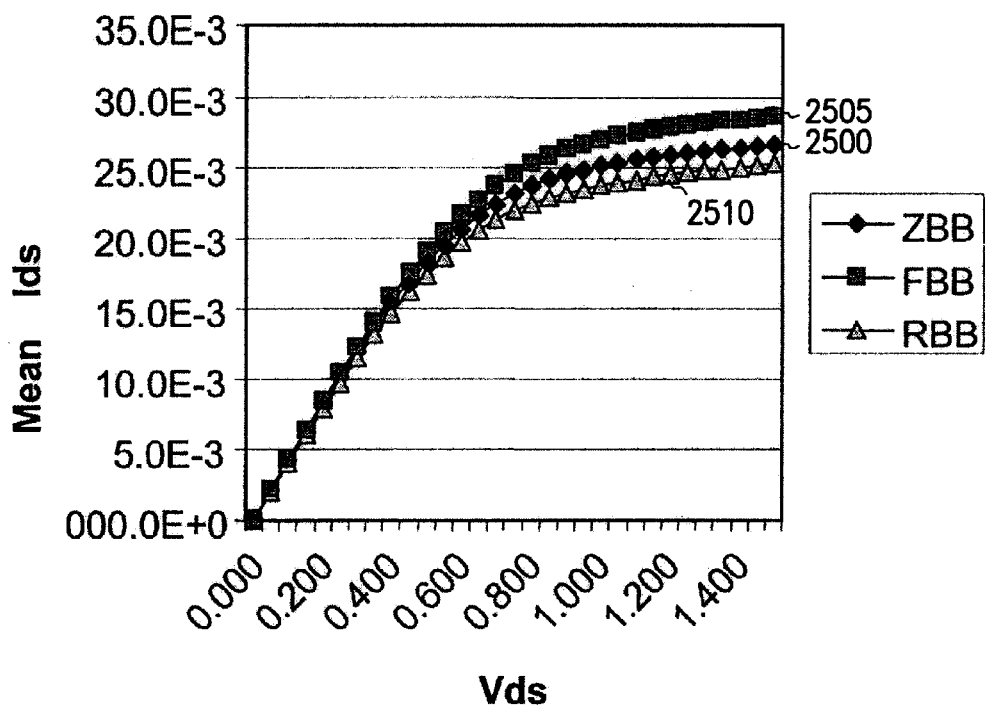
FIG. 25 is a graph example of experimental data of average $|Ids|$ vs. $|Vds|$ for n=126 n-channel FETs for a particular value of $|Vgs|$, such as, for example, $|Vgs|=1.5$ V. 1.5 V) as compared to zero-biasing.

FIG. 25 is a graph example of experimental data of average |Ids| vs. |Vds| for n=126 n-channel FETs for a particular value of |Vgs|, such as, for example, |Vgs|=1.5 V. In this example, data 2500 represents a FET with zero source-body bias. Data 2505 represents a FET with about 500 millivolts of source-body forward-bias. Data 2510 represents a FET with a reverse-biased source-body junction. In this example, forward-biasing the source-body junction increases the mean |Ids| by about 7% (at |Vds|=1.5 V) as compared to zero-biasing.

Figure 26:
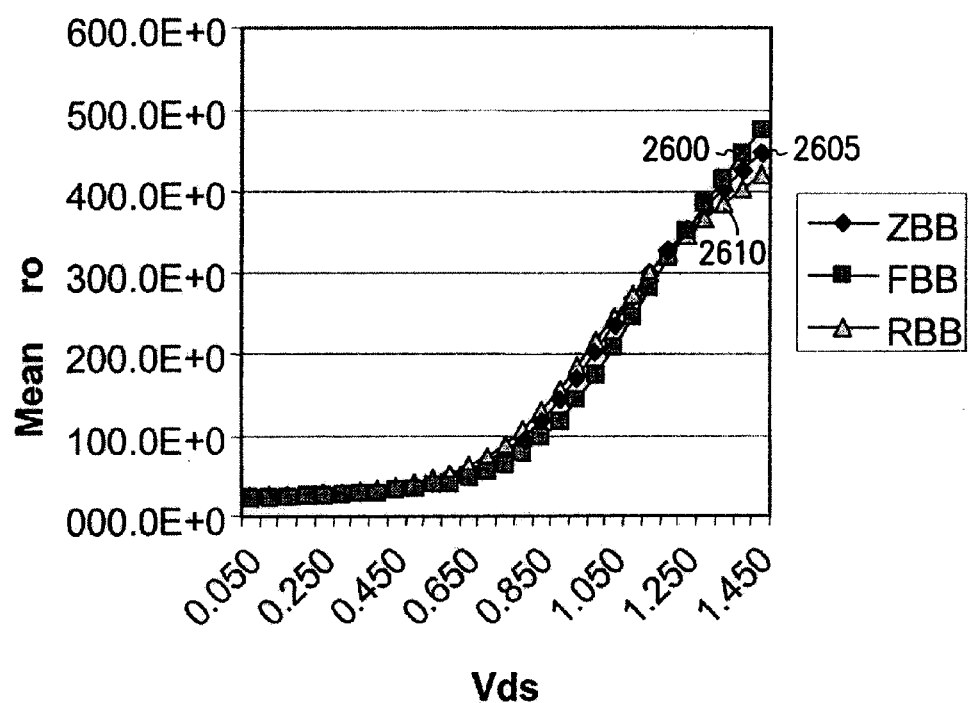
FIG. 26 is a graph example of experimental data of average $r_o$ vs. $|Vds|$ for n=126 n-channel FETs for a particular value of $|Vgs|$, such as, for example, $|Vgs|=1.5$ V.

FIG. 26 is a graph example of experimental data of average $r_o$ vs. |Vds| for n=126 n-channel FETs for a particular value of |Vgs|, such as, for example, |Vgs|=1.5 V. In this example, data 2600 represents a FET with zero source-body bias. Data 2605 represents a FET with about 500 millivolts of source-body forward-bias. Data 2610 represents a FET with a reverse-biased source-body junction. In this example, when compared to zero-biasing at the same value of |Ids|, forward-biasing the source-body junction (at |Vds|=1.5 V) decreases |Vgs| by about 6% and increases the mean $r_o$ by about 12%.

FIGS. 6–26 illustrate, among other things, that source-body forward-biasing allows improved device performance in transconductance, output impedance, and drain-source current. It is understood that these advantages of source-body forward-biasing can be traded for other design advantages, such as integrated circuit area savings or power savings, because circuits designed for a certain transconductance or output impedance can use lower bias currents and/or smaller device sizes to achieve the same performance.

Experimental data also indicates that applying the source-body forward-biasing reduces statistical variations in $g_m$ and |Ids| among samples. In one experiment, for 66 samples that were tested, applying the source-body forward-biasing reduced $g_m$ variation from about 5.4% (for zero-bias source-body) to about 3.5% (for about 450 mV forward-biased source-body), and reduced the |Ids| variation from about 10% (for zero-bias source-body) to about 5.8% (for about 450 mV forward-biased source-body). Moreover, for |Vgs|=1.5V and |Vds|=1.5V, applying the source-body forward-biasing reduced $r_o$ variation among the 66 samples from about 7.7% (for zero-bias source-body) to about 7.4% (for about 450 mV forward-biased source-body). Thus, a particular manufactured buffer is more likely to provide an output voltage that is closer to its intended design value when the source-body forward-biasing is applied. In addition to improving the performance of the buffer, it assists in increasing the percentage of good integrated circuit die yielded from a particular semiconductor wafer, thereby reducing manufacturing costs.

It is to be understood that the above description is intended to be illustrative, and not restrictive. For example, the above-described embodiments may be used in combination with each other. Moreover, it is understood that FET source and drain regions are interchangeable. Many other embodiments will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein."

What is claimed is:

1. A voltage buffer, including:
    a first source-follower, of a first conductivity type, including an input and an output, the input adapted to receive an input voltage, and the output adapted to provide an output voltage representative of the input voltage;
    a first load device coupled to the output of the first source follower; and
    wherein at least one of the first source-follower and the first load device includes at least one forward-biased field-effect transistor (FET) source-body junction.

2. The buffer of claim 1, further including a second source-follower, of a second conductivity type different from the first conductivity type, having an output coupled to the input of the first source-follower and an input adapted to receive an input voltage, the first source-follower adapted to provide an output voltage representative of the input voltage at the input of the second source-follower.

3. The buffer of claim 2, further including:
    first and second power supply nodes, the first load coupled between the output of the first-source follower and the first power supply node; and
    a second load coupled between the output of the second source-follower and the second power supply node.

4. The buffer of claim 3, in which the first load and the first source-follower are coupled to each other and to a voltage that forward-biases at least one source/drain body junction of the first load or the first source-follower.

5. The buffer of claim 3, in which at least one of the first and second loads includes a FET that has a gate terminal connected to a source/drain terminal.

6. An integrated circuit including the buffer of claim 1, the integrated circuit further including:
    a voltage reference circuit to provide a reference voltage coupled to the input of the first source-follower; and
    a load circuit, having an input coupled to receive the output voltage of the first source-follower.

7. An electronic device including the integrated circuit of claim 6.

8. A method of voltage buffering including:
    receiving an input voltage;
    translating the input voltage in a first direction through a first source-follower to provide an output voltage; and
    reducing an output impedance at which the output voltage is provided, including forward-biasing a source/drain-body junction of a field-effect transistor that translates the input voltage to provide the output voltage.

9. The method of claim 8, in which reducing the output impedance further includes diode-connecting a load field-effect transistor.

10. The method of claim 9, including providing a single bias voltage to a body terminal of each of the field-effect transistor that translates the input voltage and a load field-effect transistor.

11. The method of claim 10, including providing different bias voltages to respective body terminals of the first source-follower and the load field-effect transistor.

12. A voltage buffer, including:
    a first source-follower, of a first conductivity type, including an input and an output, the input coupled to receive an input voltage; and
    a second source-follower, of a second conductivity type different from the first conductivity type, having an input coupled to the output of the first source-follower and an output, the second source-follower adapted to provide an output voltage representative of the input voltage at the input of the first source-follower.

13. The buffer of claim 12, in which the second source-follower includes a field-effect transistor that includes at least one forward-biased junction between a source/drain and a body of the second source-follower.

14. The buffer of claim 12, further including a first load coupled to the output of the second source-follower.

15. The buffer of claim 14, in which the first load includes a field-effect transistor that includes at least one forward-biased junction between a source/drain and a body of the first load.

16. The buffer of claim 14, in which the first load includes a diode-connected field-effect transistor.

17. The buffer of claim 12, further including:

first and second power supply nodes;

a first load coupled between the output of the second source-follower and the first power supply node; and a second load coupled between the output of the first source-follower and the second power supply node.

18. The buffer of claim 17, in which the first load and the second source-follower are coupled to each other and to a voltage that forward-biases at least one source/drain-body junction of the first load or the second source-follower.

19. The buffer of claim 18, in which the first load includes a field-effect transistor that has a gate terminal connected to a source/drain terminal and to the output of the second source-follower.

20. The buffer of claim 17, in which the first load includes a field-effect transistor that has a gate terminal connected to a source/drain terminal and to the output of the second source-follower.

21. A method of voltage buffering including:

receiving an input voltage;

translating the input voltage in a first direction to obtain an intermediate voltage; and translating, into an output voltage, the intermediate voltage in a second direction, opposite to the first direction.

22. The method of claim 21, in which translating the input voltage in the first direction includes translating the input voltage through a first source-follower.

23. The method of claim 21, in which translating the intermediate voltage in the second direction includes translating the intermediate voltage through a second source-follower.

24. The method of claim 21, in which translating the input voltage in the first direction includes translating the input voltage to provide the intermediate voltage that is more negative than the input voltage.

25. The method of claim 21, in which translating the intermediate voltage in the second direction includes translating the intermediate voltage to provide the output voltage that is more positive than the intermediate voltage.

26. The method of claim 21, in which translating the intermediate voltage in the second direction includes translating the intermediate voltage to provide the output voltage that is approximately equal to the input voltage.

27. The method of claim 21, further including reducing an output impedance at which the output voltage is provided.

28. The method of claim 27, in which reducing the output impedance includes forward-biasing a source/drain-body junction of a field-effect transistor that translates the intermediate voltage to provide the output voltage.

29. The method of claim 28, in which reducing the output impedance further includes diode-connecting a load field-effect transistor.

30. The method of claim 27, in which reducing the output impedance includes diode-connecting a load field-effect transistor.

31. An integrated circuit including:

a voltage reference circuit to provide a reference voltage;

voltage buffer circuit, including:

a first source-follower, of a first conductivity type, having an input to receive the reference voltage and an output; and a second source-follower, of a second conductivity type different from the first conductivity type, having an input coupled to the output of the first source-follower and an output to provide an output voltage that is based on the reference voltage at the input of the first source-follower; and a load circuit, having an input coupled to receive the output voltage of the second source-follower of the voltage buffer circuit.

32. The integrated circuit of claim 31, in which the second source-follower of the voltage buffer includes a field-effect transistor that includes at least one forward-biased junction between a source/drain and a body of the second source-follower.

33. The integrated circuit of claim 31, further including a first load coupled to the output of the second source-follower of the voltage buffer.

34. The integrated circuit of claim 33, in which the first load includes a field-effect transistor that includes at least one forward-biased junction between a source/drain and a body of the first load.

35. The integrated circuit of claim 33, in which the first load includes a diode-connected field-effect transistor.

36. An electronic device including the integrated circuit of claim 31.

* * * * *